(12) United States Patent
Miyazawa

(10) Patent No.: US 9,679,952 B2
(45) Date of Patent: Jun. 13, 2017

(54) ORGANIC ELECTROLUMINESCENCE DISPLAY DEVICE

(71) Applicant: Japan Display Inc., Tokyo (JP)

(72) Inventor: Toshio Miyazawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 7 days.

(21) Appl. No.: 14/811,445

(22) Filed: Jul. 28, 2015

(65) Prior Publication Data

US 2016/0043161 A1  Feb. 11, 2016

(30) Foreign Application Priority Data

Aug. 7, 2014  (JP) ................................ 2014-161625

(51) Int. Cl.
  *H01L 27/32* (2006.01)
  *H01L 51/52* (2006.01)

(52) U.S. Cl.
  CPC ...... *H01L 27/3246* (2013.01); *H01L 27/3279* (2013.01); *H01L 51/5271* (2013.01); *H01L 2227/323* (2013.01); *H01L 2251/558* (2013.01)

(58) Field of Classification Search
  CPC ............. H01L 51/0545; H01L 51/0036; H01L 51/0541; H01L 51/5012
  See application file for complete search history.

(56) References Cited

U.S. PATENT DOCUMENTS 7,573,191 B2 * 8/2009 Kobayashi .......... H01L 27/3211
                                                          313/501
9,337,244 B2 * 5/2016 Hatano ............... H01L 27/3246

FOREIGN PATENT DOCUMENTS

JP       2005-268024 A    9/2005
JP       2008-135325 A    6/2008

* cited by examiner

*Primary Examiner* — Quoc Hoang
(74) *Attorney, Agent, or Firm* — TYPHA IP LLC

(57) ABSTRACT

An organic electroluminescence display device including pixels, a first bank provided between the pixels and covering a periphery edge part of a pixel electrode, a second bank provided on a first upper surface of the first bank and including a second upper surface and a first side surface, an auxiliary wiring provided on the second upper surface and including a third upper surface and a second side surface, an organic electroluminescence layer in contact with the pixel electrode, the first and second banks, and the auxiliary wiring, a common pixel electrode bridging the pixels, the organic electroluminescence layer includes a first region in contact with the pixel electrode, the first upper surface and the first side surface, and a second region in contact with the auxiliary wiring and separated from the first region, and the common pixel electrode is in contact with the second side surface.

18 Claims, 21 Drawing Sheets

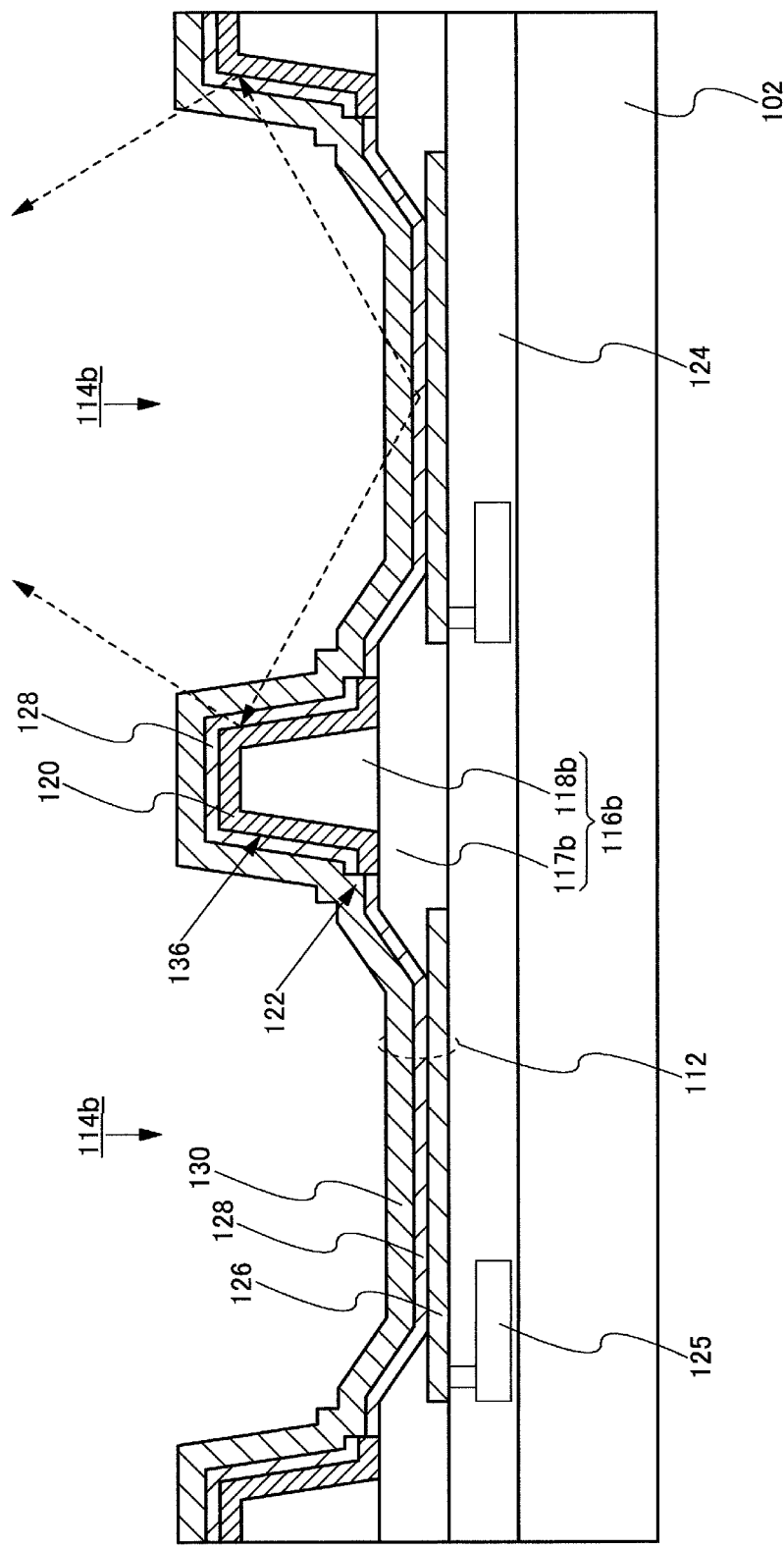

ORGANIC ELECTROLUMINESCENCE DISPLAY DEVICE

CROSS-REFERENCE TO RELATED APPLICATIONS

This application is based upon and claims the benefit of priority from the prior Japanese Patent Application No. 2014-161625, filed on Aug. 7, 2014, the entire contents of which are incorporated herein by reference.

FIELD

The present invention is related to a structure of a pixel part in an organic electroluminescence display device formed with a pixel using a light emitting element such as an organic electroluminescence element.

BACKGROUND

An organic electroluminescence (referred to below as [organic EL]) display device is provided with an organic EL element in each pixel and displays an image by controlling light emittance. An organic EL element has a structure in which a layer (referred to below as [organic EL layer]) including an organic EL material sandwiched between a pair of electrodes wherein one is an anode electrode and the other is a cathode electrode. In an organic EL display device, one of the electrodes is provided as a pixel electrode for each pixel and the other electrode is provided as a common pixel electrode bridging a plurality of pixels and is supplied with a common potential. In an organic EL display device, the light emitted from a pixel is controlled by supplying a potential of the pixel electrode for each pixel with respect to the potential of the common pixel electrode.

In an organic EL element, it is necessary for at least the electrode on the side which outputs light emitted by an organic EL layer to have translucency. Although a metal semi-transparent film formed by an ultrathin film is sometimes used a translucent electrode, in many cases, the electrode is formed using a transparent conductive film material represented by ITO (indium added with tin oxide). For example, in an organic EL display device, in the case where the light emitted by an organic EL element in a pixel is output from a common electrode side, a reflective surface of a metal is provided on a pixel electrode and the common pixel electrode is formed using a transparent electrode material.

A transparent conductive film material is a metal oxide and becomes problematic since its resistance is high compared to a metal material such as aluminum. In an organic EL display device, because a common pixel electrode is formed as an integrated electrode across roughly the entire surface of a pixel region, when the area of the pixel region becomes large, that is, when the size of the screen becomes large, the effects of the resistance of the common pixel electrode formed with a transparent conductive material cannot be neglected. Image quality defects called shading occurs when there are common pixel electrode resistance effects. Shading is a phenomenon whereby when a drop in voltage due to an increase in electrode resistance can no longer be neglected, variation in luminosity occurs within a display screen and display quality deceases. When shading occurs, defects such as drop in luminosity of a central region compared to an exterior side region of a screen become visible.

In order to solve this problem, providing auxiliary wiring in a pixel part in order to reduce the resistance value of a common pixel electrode has been proposed. In order to reduce apparent resistance of a common pixel electrode using auxiliary wiring, it is necessary to connect the auxiliary wiring with the common pixel electrode within a region of a pixel part. In this case, since forming auxiliary wiring together with a photolithography process after forming an organic EL layer is difficult because this causes the organic EL layer to deteriorate, usually it is preferred that the auxiliary wiring is formed first.

For this reasons, a method for connecting a common pixel electrode and auxiliary wiring by connecting the common pixel electrode and auxiliary wiring provided on a lower layer thereof via a contact hole, and a method of physically removing an organic EL layer and forming a contact in the case where the organic EL layer exists between the common pixel electrode and auxiliary wiring have been proposed.

For example, a structure is disclosed in Japanese Laid Open Patent No. 2008-135325 in which auxiliary wiring is formed in advance above a bank which encloses a pixel electrode and the auxiliary wiring and common pixel electrode are connected above the bank. The structure disclosed in Japanese Laid Open Patent No. 2008-135325 is formed by providing auxiliary wiring on a lower layer, center layer and upper layer wherein the upper layer protrudes further than the center layer and the lower layer is hidden beneath the peak of the upper layer. Even when an organic EL layer is deposited after a three structure auxiliary wiring is formed, the organic EL layer is not deposited on the lower layer due to the peak of the upper layer. When a common pixel electrode is formed above an organic EL layer using a sputtering method and a cover layer is wrapped around the lower layer of the auxiliary wiring, it is possible to connect the common pixel electrode with the auxiliary wiring even if a contact hole is formed.

As another example of connecting a common electrode with auxiliary wiring, an organic EL device is disclosed in Japanese Laid Open Patent No. 2005-268024 in which a metal film is formed on upper surface of a bank and this is used as the auxiliary wiring of the common pixel electrode. In Japanese Laid Open Patent No. 2005-268024, when a metal film which acts as an anode protective layer using a bank having a T shape or reverse taper shape cross-sectional shape as a mask is formed above an anode, a metal layer formed above the bank is simultaneously used as auxiliary wiring. Since the metal layer is separated from a metal layer deposited on a lower layer due to the shape of the bank, this is used as the auxiliary wiring of the common pixel electrode.

However, since the auxiliary wiring disclosed in Japanese Laid Open Patent No. 2008-135325 and Japanese Laid Open Patent No. 2005-268024 both contact with a common pixel electrode on a flat surface, a fixed area is taken up within a region of a pixel part. As a result, the area which can be used as a pixel is reduced and the aperture ratio is reduced.

When trying to achieve high definition of a pixel, it is necessary to reduce pixel pitch and increase the number of pixel per unit area. At this time, it is necessary to perform a miniaturization process to provide auxiliary wiring above a bank and it is difficult secure an area for contacting the auxiliary wiring with a common pixel electrode even if the auxiliary wiring can be miniaturized.

SUMMARY

According to one embodiment of the present invention, an organic electroluminescence display device including a plurality of pixels located in a pixel part, a pixel electrode provided for each of the plurality of pixels, a first bank provided between the plurality of pixels and covering a periphery edge part of the pixel electrode, a second bank provided on a first upper surface of the first bank and including a second upper surface and a first side surface, the first side surface intersecting the first upper surface and the second upper surface, an auxiliary wiring provided on the second upper surface of the second bank and including a third upper surface and a second side surface intersecting the third upper surface, an organic electroluminescence layer in contact with the pixel electrode, the first bank, the second bank and the auxiliary wiring, a common pixel electrode bridging the plurality of pixels and covering the pixel electrode, the first bank, the second bank, and the auxiliary wiring, wherein the organic electroluminescence layer includes a first region and a second region separated from the first region, the first region is in contact with the pixel electrode, the first upper surface, and the first side surface, the second region is in contact with the auxiliary wiring, and the common pixel electrode is in contact with the second side surface of the auxiliary wiring.

According to one embodiment of the present invention, an organic electroluminescence display device including a plurality of pixels located in a pixel part, a pixel electrode provided for each of the plurality of pixels, a bank provided between the plurality of pixels and covering a periphery edge part of the pixel electrode, an auxiliary wiring provided on the bank, an organic electroluminescence layer in contact with the pixel electrode, the bank, and the auxiliary wiring, a common pixel electrode bridging the plurality of pixels and covering the pixel electrode, the bank, and the auxiliary wiring, wherein an end part of the auxiliary wiring is located on an upper surface of the bank so that the end part and the upper surface forms a step part, the organic electroluminescence layer is separated at the step part, and the common pixel electrode is in contact with a side surface part of the auxiliary wiring.

According to one embodiment of the present invention, an organic electroluminescence display device including a plurality of pixels located in a pixel part, a pixel electrode provided for each of the plurality of pixels, a bank provided between the plurality of pixels and covering a periphery edge part of the pixel electrode, an auxiliary wiring provided on the bank, an organic electroluminescence layer in contact with the pixel electrode, the bank, and the auxiliary wiring, a common pixel electrode bridging the plurality of pixels and covering the pixel electrode, the bank, and the auxiliary wiring, the bank includes a first side surface intersecting a main surface of the pixel electrode, the auxiliary wiring includes a second side surface in contact with the first side surface, the organic electroluminescence layer is separated at the first side surface and the second side surface, and the common pixel electrode is in contact with the second side surface of the auxiliary wiring.

BRIEF DESCRIPTION OF DRAWINGS

FIG. 6 is a diagram showing a cross-sectional structure of a pixel of an organic EL display device related to one embodiment of the present invention;

DESCRIPTION OF EMBODIMENTS

Figure 1:
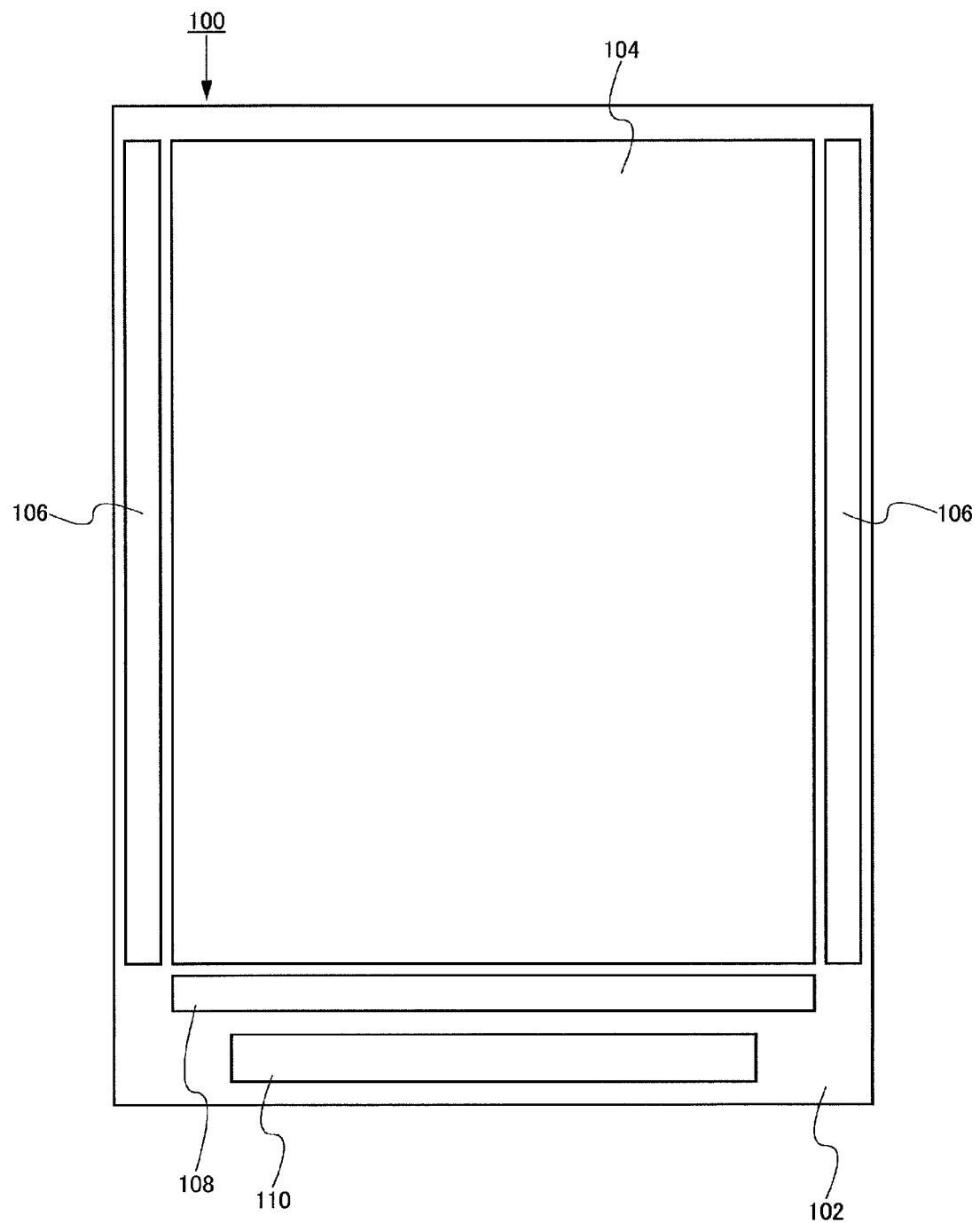
FIG. 1 is a diagram showing a structure of an organic EL display device related to one embodiment of the present invention.

Each embodiment of the present invention is explained below while referring to the drawings. Furthermore, the disclosure is merely one example and various modifications which conform to the premise of the invention and which could be easily conceived of by person ordinarily skilled in the art are included within the scope of the present invention.

In addition, in order to further clarify explanation, the drawings may be expressed schematically with respect to the width, thickness and shape of each part compared to actual appearance and are only examples and do not limit the interpretation of the present invention. In addition, in the specification and each drawing the same reference symbols are attached to the same devices that have previously been described or already exist in previous drawings and therefore a detailed explanation is sometimes omitted where appropriate.

In the present specification, in the case where certain components or areas are present "over" or "under" and "above" or "below" other components or areas, as long as there are no particular limitations, this includes not only the case where components or areas are directly above or directly below other components or areas but also the case where components or areas are above or below other components or areas with other structural components provided in between.

First Embodiment

<Organic EL Display Device>

FIG. 1 shows a structure of an organic EL display device 100 related to one embodiment of the present invention. The organic EL display device 100 is provided with a pixel part 104 formed with a display screen above a substrate 102. A perpendicular scanning circuit 106 for inputting a signal to the pixel part 104, a horizontal path circuit 108 and a driver IC 110 etc. may be further added above the substrate 102 as other elements.

Figure 2A:
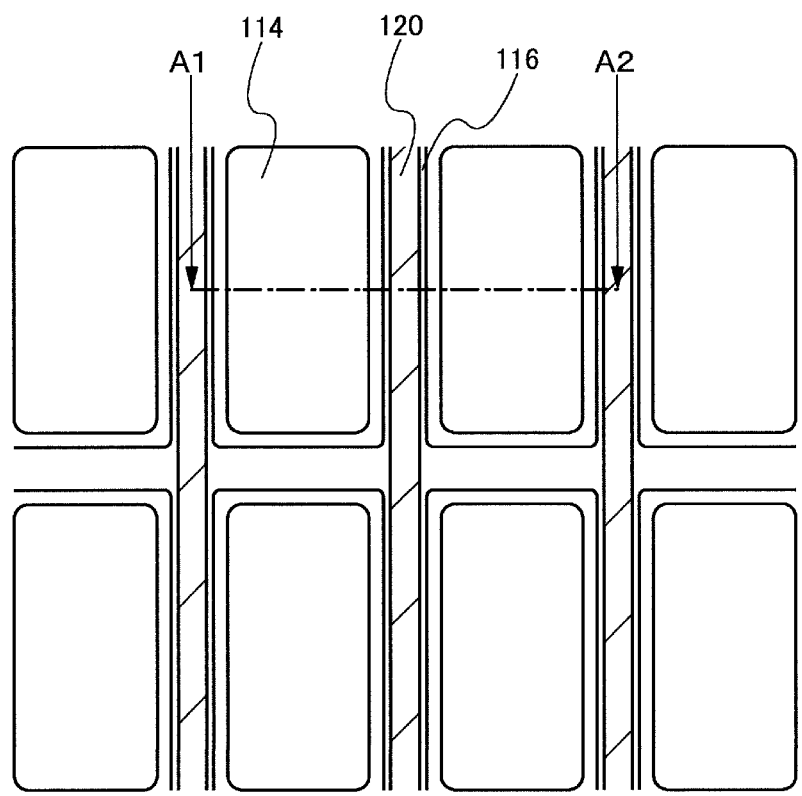
FIG. 2A is a diagram showing a structure of a pixel part of an organic EL display device related to one embodiment of the present invention.

FIG. 2A shows an array of pixels 114 in the pixel part 104, a bank 116 which encloses the pixels 114 and auxiliary wiring 120 provided above the bank 116. A plurality of pixels 114 are provided in the pixel part 104. Although an example of the pixel part 104 is shown in FIG. 2A provided with pixels 114 in a stripe shape, the arrangement of the pixels 114 may be a delta arrangement, a Bayer arrangement or an arrangement which realizes a pentile structure.

Figure 2B:
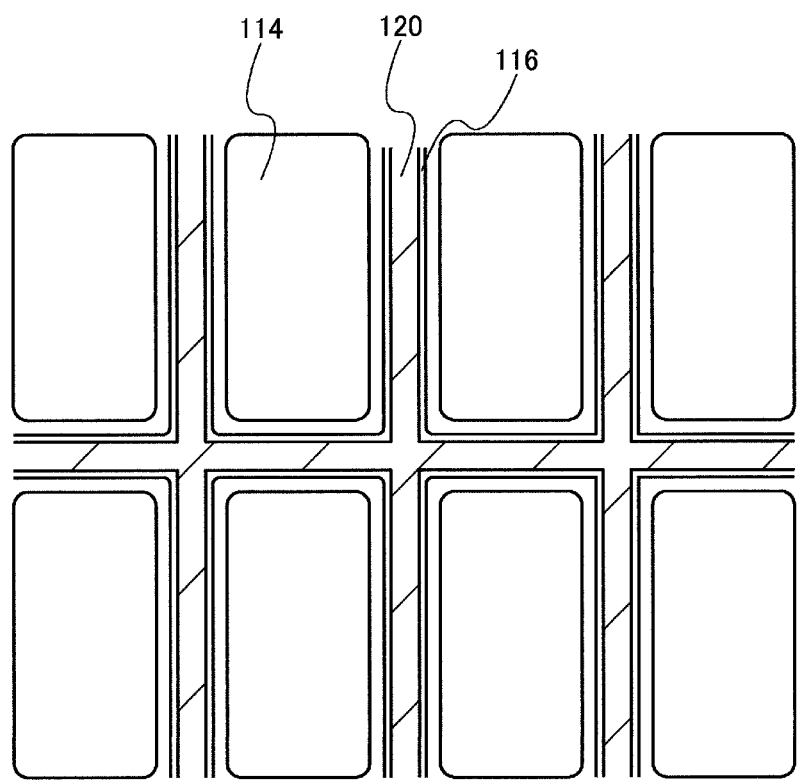
FIG. 2B is a diagram showing a structure of a pixel part of an organic EL display device related to one embodiment of the present invention.

The pixel 114 is enclosed by a partition wall called the bank 116 which sections adjacent pixels. The auxiliary wiring 120 is provided on an upper surface of the bank 116. FIG. 2A shows a form in which the auxiliary wiring 120 is provided to extend in one direction (for example Y direction) along an array of pixels. FIG. 2B shows another form of the auxiliary wiring 120 and shows another example in which the wiring is provided to extend in a direction (for example X direction) which intersects the direction described above. In both the case shown in FIG. 2A and FIG. 2B the auxiliary wiring 120 is provided so as to cover the entire pixel part 104.

<Pixel Structure>

Figure 3:
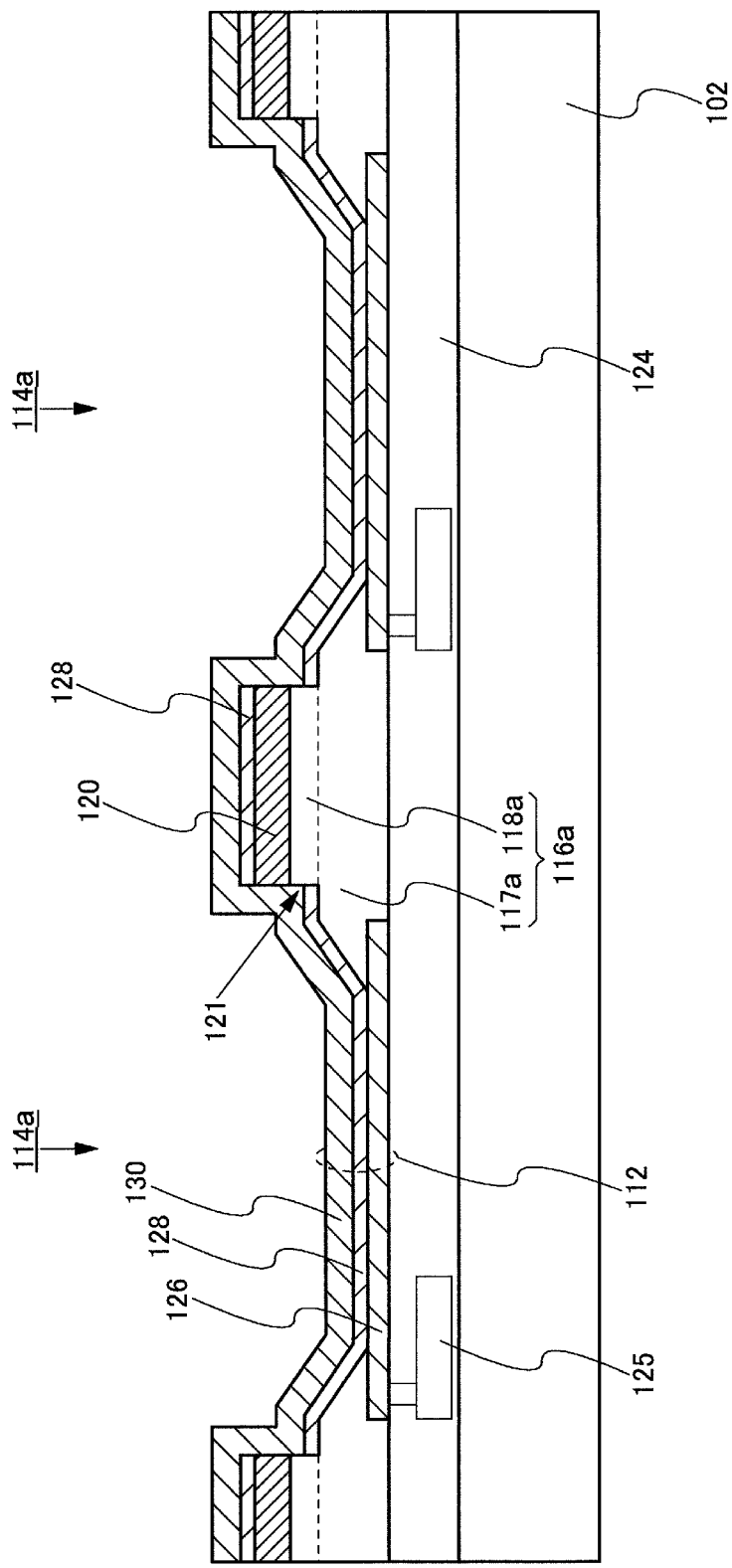
FIG. 3 is a diagram showing a cross-sectional structure of a pixel part of an organic EL display device related to one embodiment of the present invention.

A cross-sectional structure of a pixel along the line A1-A2 shown in FIG. 2A is shown in FIG. 3. FIG. 3 shows a form in which two pixels 114a are provided adjacent to each other. An organic EL element 112 is provided in the pixel 114a. The organic EL element 112 has a structure in which an organic EL layer 128 is sandwiched by a pixel electrode 126 and a common pixel electrode 130 provided facing the pixel electrode 126. The pixel electrode 126 is provided independently for each pixel and each is connected with a drive element 125 formed from a transistor etc.

A bank 116a is provided between two adjacent pixels. The bank 116a is provided so that an end part covers a periphery edge part of the pixel electrode 126. When viewing a cross-section of the bank 116a, the bank 116a has an incline surface (or taper part) which has a thickness which gradually increases towards an inner side region from an end part which overlaps the pixel electrode 126. The bank 116a includes a step part 121 which protrudes to the upper surface in a region further to the interior side than an end part region which includes the incline surface. That is, the bank 116a includes a first region having a thickness which gradually increases from an end part region which overlaps the pixel electrode 126, and a second region having a thickness which increases steeply from an upper surface part of the first region forming the step part 121. In the present embodiment, a part corresponding to the first region is referred to as the first bank 117a and a part corresponding to the second region is referred to as the second bank 118a for simplicity.

Auxiliary wiring 120 is provided on an upper part of the bank 116a. Specifically, the auxiliary wiring 120 is provided on an upper part of the second bank 118a. The auxiliary wiring 120 is preferred to be formed from a metal material having high conductivity, for example aluminum or silver and the like. Furthermore, the auxiliary wiring 120 is not limited to metal and can be formed using another material as long as it is possible to reduce the apparent resistance of the common pixel electrode 130. For example, the auxiliary wiring 120 may also be formed using a metal oxide material having conductivity. It is possible to apply a material used in a transparent electrode such as ITO (indium oxide added with tin oxide) or IZO (indium oxide/zinc oxide) as the conductive metal oxide material. Even in the case where the auxiliary wiring 120 is formed using a metal oxide material, since the resistance of the auxiliary wiring itself is reduced if the wiring is formed thicker than the common pixel electrode 130, it is possible to reduce the surface resistance of the common pixel electrode 130.

Furthermore, the bank 116a insulates the pixel electrodes 126 of each adjacent pixel. Therefore, it is preferred that the bank 116a is formed using an insulation material. For example, the bank 116a is formed using an organic material such as polyimide or acrylic or an inorganic material such as silicon oxide and the like.

The organic EL display device shown in the present embodiment outputs light emitted by the organic EL element 112 to the common pixel electrode 130 side or what is known as a top emission type structure. Since the pixel electrode 126 reflects light emitted by the organic EL layer 128 to the common pixel electrode 130 side, it is preferred that the pixel electrode 126 is formed using a metal film with high reflectance. Alternatively, the pixel electrode 126 may be formed using a stacked structure of a metal film and transparent conductive film including a light reflecting surface. On the other hand, since the common pixel electrode 130 allows light emitted by the organic EL layer 128 to pass through, it is preferred that the common pixel electrode 126 is formed from a transparent conductive film such as ITO (indium oxide added with tin oxide) or IZO (indium oxide/zinc oxide) having both translucency and conductivity. Alternatively, the common pixel electrode 130 may be formed using a metal layer having a thickness which allows output light to pass through. Furthermore, although not shown in the diagram, it is preferred that a protective film be provided on an upper part of the common pixel electrode 130. As long as the protective film is an insulation film that can block the infiltration of water, then a material such as a silicon nitride film may be used.

The organic EL layer 128 is formed using a low molecular or high molecular organic material. In the case where a low molecular organic material is used, the organic EL layer 128 may be formed including a hole injection layer or electron injection layer sandwiching a light emitting layer which includes an organic material with light emitting properties, and a hole transport layer or electron transport layer. The light emitting layer included in the organic EL layer 128 may emit light in each of three colors red (R), green (G) and blue (B) forming what is known as white light emittance.

The organic EL layer 128 and common pixel electrode 130 are formed so as to cover the pixel electrode 126, bank 116 and auxiliary wiring 120 while they are in a provided state. Since the organic EL layer 128 is formed to a thickness of about 100 nm, the step part 121 in the bank 116*a* or a part which protrudes from the first bank 117*a* in which the step part 121 is added to the auxiliary wiring 120 cannot be covered and becomes separated. In other words, the organic EL layer 128 is provided so as to cover the upper surface of the first bank 117*a* and the upper surface of the auxiliary wiring 120 from the pixel electrode 126, becomes separated by the step part 121 and the side surface part of the auxiliary wiring 120 cannot be sufficiently covered.

Furthermore, in the case where the organic EL layer 128 in the organic EL element 112 includes a tandem type structure in which a plurality of light emitting units including one light emitting layer are stacked vertically, an intermediate conductive layer provided between the upper and lower light emitting units conducts with an adjacent pixel which is a problem. However, when the organic EL layer 128 is separated by the step part 121, it is possible to prevent a leakage current of the intermediate conductive layer specifically generated in a tandem type structure.

On the other hand, the common pixel electrode 130 is sufficiently thicker than the organic EL layer 128 and can be provided with a thickness which can cover not only the step part in the bank 116*a* but also the side surface part of the auxiliary wiring 120. In the case where a metal layer having a thickness that allows output light to pass through is used as the common pixel electrode 130, a transparent conductive film may be further stacked on the metal layer to a thickness sufficient to cover the step part 121. For example, the thickness of common pixel electrode 130 is preferred to be 1.5 to 5 times the thickness of the organic EL layer 128 so that it is possible to cover a side surface part of the auxiliary wiring 120 without receiving the effects of the step part 121. In this way, since the common pixel electrode 130 is in contact with at least the side surface part of the auxiliary wiring 120. It is possible obtain electrical conductivity with the auxiliary wiring 120. For example, in the case where the thickness of the organic EL layer 128 is 100 nm, the height of the step part 121 may be set to 200 nm to 1000 nm.

When the connection structure of the common pixel electrode 130 and the auxiliary wiring 120 shown in FIG. 3 is explained from the viewpoint of a manufacturing method, the organic EL layer 128 is preferred to be formed with a film formation method with comparatively bad step covering properties with respect to the bank 116*a* and a cover film surface provided with the auxiliary wiring 120, and the common pixel electrode 130 is preferred to be formed with a film formation method with good step covering properties. For example, it is preferred that the organic EL layer 128 is formed with directionality and the common pixel electrode 130 is formed with a formation method having a low directionality and good wrapping. As a specific example, the organic EL layer 128 is preferred to formed using a vacuum evaporation method and the common pixel electrode 130 is preferred to be formed using a sputtering method or vapor deposition method so that a cover film wraps up to the step part compared to a vacuum evaporation method.

In addition, since the organic EL layer 128 is formed after forming the auxiliary wiring 120 when seen from a stacking order, the organic EL layer 128 is attached to the upper surface part of the auxiliary wiring 120. Since the organic EL layer 128 includes a relatively thin layer with high resistance, even if the common pixel electrode 130 is formed above this, electrical conductivity can be made with the auxiliary wiring 120. However, when the organic EL layer 128 is separated by the step part 121 and the side surface part of the auxiliary wiring 120 is exposed, it is possible to electrically connect the common pixel electrode 130 with the auxiliary wiring 120 using this part. In other words, by forming the common pixel electrode 130 bridging a plurality of pixels, the common pixel electrode 130 is electrically connected with the auxiliary wiring 120 at the side surface part of the auxiliary wiring 120 exposed above the step part 121. In this way, the resistance of the common pixel electrode 130 can be substantially reduced by the auxiliary wiring 120 and display defects can be controlled.

<Connection Between Common Pixel Electrode and Auxiliary Wiring>

Figure 4:
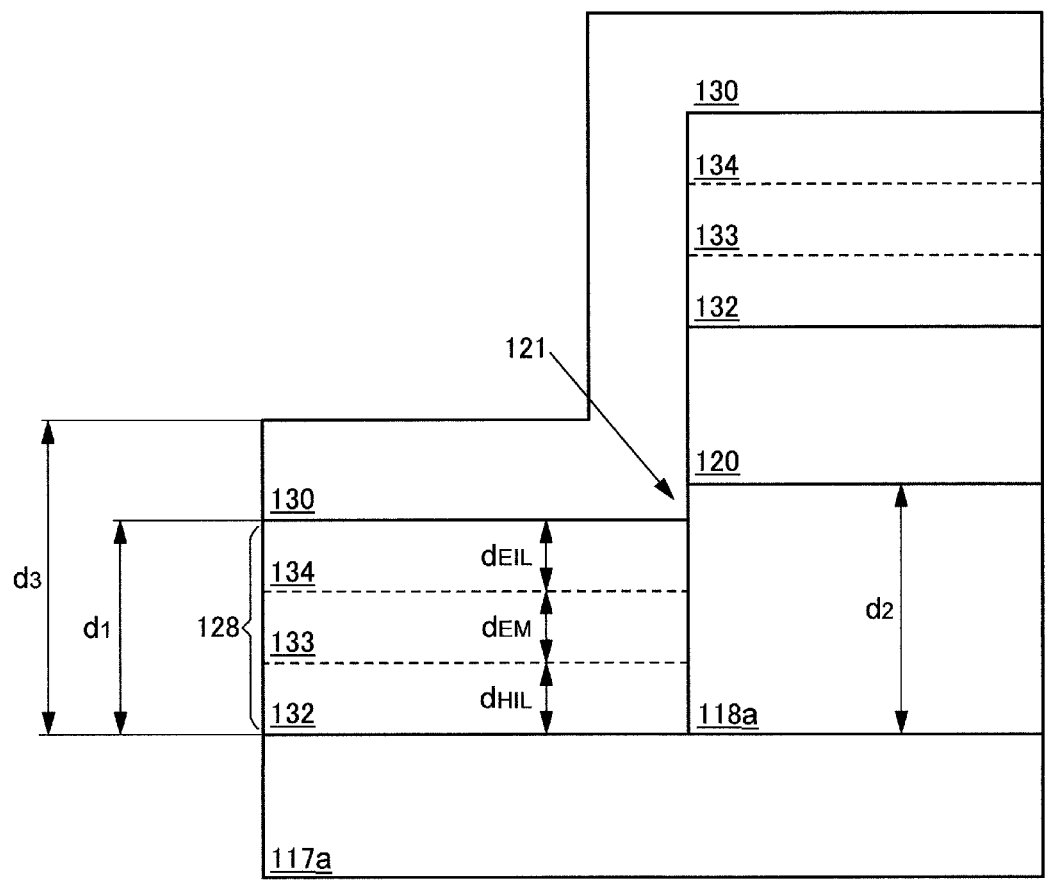
FIG. 4 is a diagram for explaining a connection between a common pixel electrode and auxiliary wiring in a pixel of an organic EL display device related to one embodiment of the present invention.

As is shown in the present embodiment, a structural schematic view is shown in FIG. 4 in the case where a second bank 118*a* is provided above the first bank 117*a* and the auxiliary wiring 120 is further provided above the second bank 118*a*. The step part 121 is provided via the second part 118*a* on an upper part of the first bank 117*a*. When the film thickness of the organic EL layer 128 is smaller than the height of the step part 121, that is, the height of the second bank 118*a*, it is difficult for the organic EL layer 128 to completely cover the step part 121.

Here, in FIG. 4, the film thickness of the organic EL layer 128 is given as d1, the height of the second bank 118*a* is given as d2, and the total thickness of the organic EL layer 128 and the common pixel electrode 130 is given as d3. In addition, the film thickness of the hole injection layer 132, light emitting layer 133 and electron injection layer 134 included in the organic EL layer 128 are given HIL, dEM and dEIL respectively.

When the height d2 of the second bank 118*a* is set larger than the film thickness d1 of the organic EL layer 128 (d1<d2) and there are no effects of wrapping of the organic EL layer 128, it is almost impossible to bury the side surface part of the auxiliary wiring 120 in the organic EL layer 128. On the other hand, in the case where the total film thickness of the organic EL layer 128 maintaining these conditions and the common pixel electrode 130 provided above is thicker than the height of the second bank 118*a*, it is possible to contact the common pixel electrode 139 at the side surface part of the auxiliary wiring 120.

In addition, in the case shown in FIG. 4, even if the film thickness d1 of the organic EL layer 128 is larger than the height of the second bank 118*a*, if the condition that the total film thickness (dHIL+dEM) of at least the hole injection layer 132 with a comparatively high resistance and the light emitting layer 133 is smaller than height d2 of the second bank 118*a* is satisfied ((dHIL+dEM)<d2), it is possible to reduce the resistance of the common pixel electrode 130 more than the auxiliary wiring 120. In this case, if the auxiliary wiring 120 and electron injection layer 134 are in contact and the resistance of the electron injection layer 134 is sufficiently low, it is possible to electrically connect the common pixel electrode 130 with the auxiliary wiring 120 via the electron injection layer 134.

In either case, since the common pixel electrode 130 is connected at the side surface part of the auxiliary wiring 120, if the thickness of the auxiliary wiring 120 is maintained even when the space between adjacent pixels is narrow, the area of the connection part is never reduced.

Consequently, it is possible to achieve a lower resistance of the common pixel electrode 130 than the auxiliary wiring 120 even when trying to achieve high definition of a pixel part.

<Manufacturing Method>

Figure 5A:
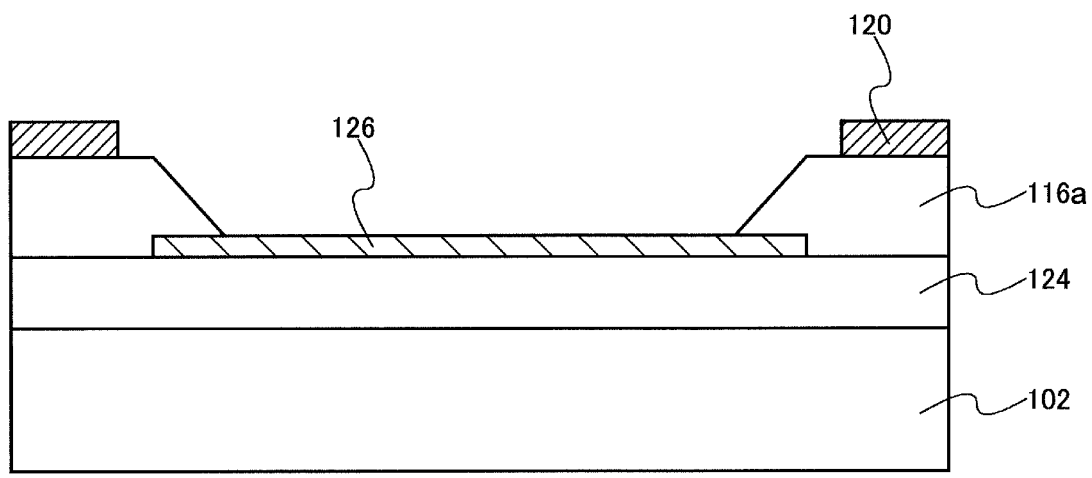
FIG. 5A is a diagram for explaining a manufacturing method of a pixel part of an organic EL display device related to one embodiment of the present invention.
Figure 5B:
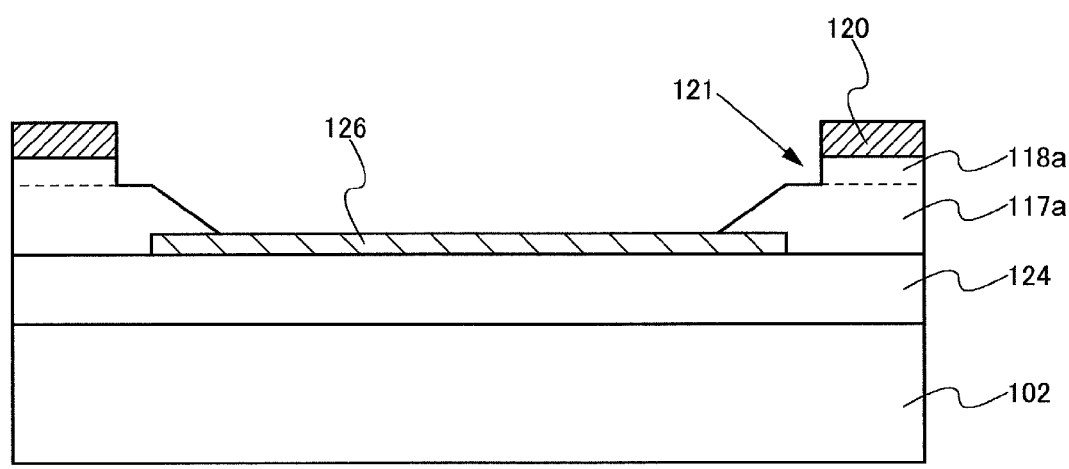
FIG. 5B is a diagram for explaining a manufacturing method of a pixel part of an organic EL display device related to one embodiment of the present invention.
Figure 5C:
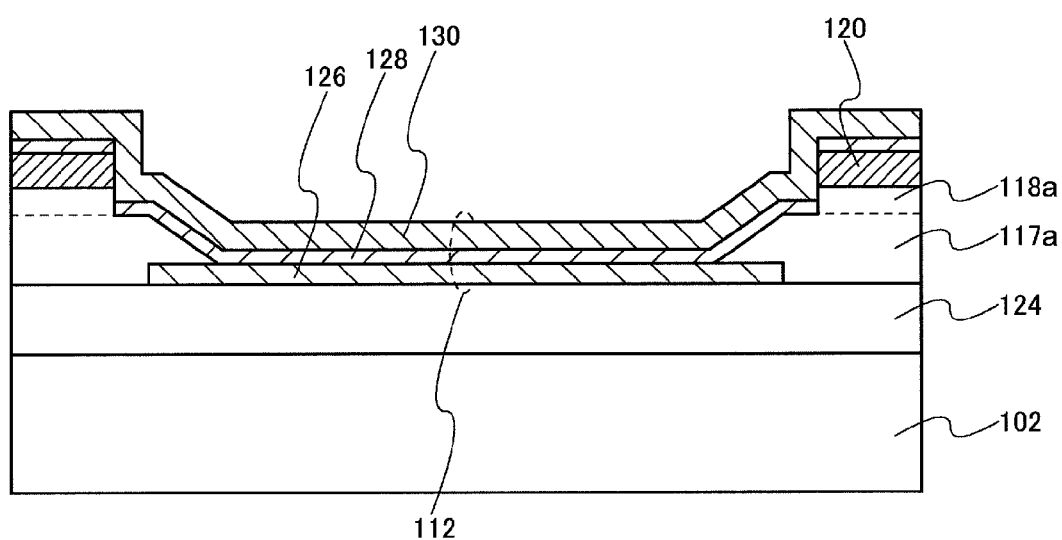
FIG. 5C is a diagram for explaining a manufacturing method of a pixel part of an organic EL display device related to one embodiment of the present invention.

A process for connecting the common pixel electrode 130 to the auxiliary wiring 120 is explained while referring to FIG. 5A to 5C.

In FIG. 5A, the pixel electrode 126 is formed above the insulation layer 124 and the bank 116a is formed so as to cover a periphery edge part. The bank 116a is preferred to be formed using an organic material such as polyimide or acrylic and may also be formed using an inorganic material such as silicon oxide and the like. The bank 116a is preferred to be formed so that the thickness of a part corresponding to the first bank 117a increases gradually towards the interior from the end part which overlaps the pixel electrode 126. The auxiliary wiring provided on an upper surface part of the bank 116a may be formed using a metal material such as aluminum or silver and a layer may be provided to achieve a good ohmic connection using a titanium, molybdenum, tungsten or a metal alloy selected from these (for example, molybdenum/tungsten allow) so as to sandwich above and below the metal layer.

As is shown in FIG. 5B, when the auxiliary wiring 120 is formed by etching, the step part 121 is provided by etching the upper surface of the bank 116a using the auxiliary wiring 120 as a mask. In this way, by including the bank 116a with regions with different thicknesses, it is possible to form the first bank 117a in an exterior region of the auxiliary wiring 120 and the second bank 118a in a region which overlaps the auxiliary wiring 120. Instead of this type of etching process, the step part 121 may be realized by forming the second bank 118a on an upper surface of the first bank 117a and further forming the auxiliary wiring 120 above the bank 118a.

FIG. 5C is shows a step of forming the organic EL layer 128 and common pixel electrode 130. As explained using FIG. 4, when the height of the step part 121 in the bank 116a is set higher than the film thickness of the organic EL layer 128, the organic EL layer 128 cannot cover the step part 121 and the side surface part of the auxiliary wiring 120 is exposed. At this stage, the common pixel electrode 130 is formed so as to cover the side surface part of the auxiliary wiring 120. In this way, it is possible to obtain an electrical connection between the common pixel electrode 130 and auxiliary wiring 120.

According to the present embodiment, by providing the step part 121 on an upper surface part of the bank 116a, providing the auxiliary wiring 120 aligned with the step part 121 and electrically connecting the common pixel electrode 130 with the side surface part of the auxiliary wiring, it is possible to reduce the surface resistance of the common pixel electrode 130. As a result, it is possible to reduce shading which is a problem in organic EL display devices. In the present embodiment, by providing a connection part between the common pixel electrode 130 and auxiliary wiring 120 on a side surface part of the auxiliary wiring 120, it is possible to reduce the area of the connection part when seen from a planar view. That is, even in the case where a pixel is high definition, the space between pixels (pixel pitch) becomes narrow and the area of the upper surface part of the bank 116a is reduced, it is possible to secure a sufficient contact area by electrically connecting the common pixel electrode 130 at the side surface part of the auxiliary wiring 120.

In the present embodiment, in the case where the organic EL layer 128 is formed by a vacuum evaporation method, it is possible to form an electrical connection structure between the common pixel electrode 130 and auxiliary wiring 120 in a self-aligned manner by using poor step covering characteristics. In this case, by providing the step part 121 in the bank 116a, it is not necessary to make the thickness of the auxiliary wiring 120 more than necessary which is effective when miniaturizing the auxiliary wiring 120 together with high definition processing of a pixel part.

According to the present embodiment, it is possible to reduce the surface resistance of the common pixel electrode 130 by connecting the common pixel electrode 130 with the side surface part of the auxiliary wiring 120 provided above the bank 116a. In this way, it is possible to control deterioration of an image quality of an organic EL display device. In addition, since it is possible to reduce the film thickness of the common pixel electrode 130 by provided the auxiliary wiring 120, it is possible to achieve an improvement in the extraction of light emitted by the organic EL element 112.

Second Embodiment

<Pixel Structure>

FIG. 6 shows the structure of a pixel 114b in a pixel part of an organic EL display device related to the present embodiment. The bank 116b in the pixel 114b includes a structure in which a first bank 117b having an incline part (taper part) in a region which overlaps at least the pixel electrode 126, and a second bank 118b which has a narrower width than the first bank.

The second bank 1178b is preferred to be on an upper surface part of the first bank 117b and have an inclined side surface. The auxiliary wiring 120 is provided so as to cover a part (preferably the side surface part) or the entire surface of the second bank 118b. The organic EL layer 128 is provided above the first bank 117b and second bank 118b (above the auxiliary wiring 120) but separated from the step part 122.

This is to provide the film thickness of the auxiliary wiring 120 thicker than the film thickness of the organic EL layer 128 and so that the organic EL layer 128 is separated by the step part 122 formed by the auxiliary wiring 120. In this way, at least one part of the end part side surface of the auxiliary wiring 120 is exposed without being covered by the organic EL layer 128. In order to obtain this form, the film thickness of the auxiliary wiring 120 is preferred to be about 2 to 10 times the film thickness of the organic EL layer 128. For example, in the case where the film thickness of the organic EL layer 128 is 100 nm, the film thickness of the auxiliary wiring 120 may be set to 200 nm to 1000 nm, for example 500 nm.

When the common pixel electrode 130 is provided on an upper surface of the organic EL layer 128 in this state so as to cover the step part 122, the common pixel electrode 130 is in contact with the end part side surface of the auxiliary wiring 120. As a result, the common pixel electrode 130 becomes electrically connected with the auxiliary wiring 120.

Furthermore, since the cross-sectional structure shown in FIG. 6 shows a structure corresponding to the line A1-A2 shown in FIG. 2A, the auxiliary wiring 120 is provided to extend in at least one direction within a region of the pixel part. In addition, although not shown in the diagram, it is preferred that a protection film is provided in advance on an upper part of the common pixel electrode 130. The protection film may be an insulation film which blocks the infiltration of water and a silicon nitride film may be used for example.

As is shown in the present embodiment, by increasing the film thickness of the auxiliary wiring 120 and providing the step part 122 which separates the organic EL layer 128, it is possible to use the end part side surface of the auxiliary wiring 120 as a connection region with the common pixel electrode 130. By electrically connecting the common pixel electrode 130 with the auxiliary wiring 120, it is possible to substantially reduce the surface resistance of the common pixel electrode 130.

In the present embodiment, when the second bank 118b is provided to protrude from an upper part of the first bank 117b, it is possible to increase the extraction efficiency of light emitted by the organic EL element 112 using this structure.

For example, by setting the side surface of the second bank 118b as an incline surface which opens towards the output direction of light and providing the auxiliary wiring 120 along the incline surface as is shown in FIG. 6, it is possible to set the incline surface as a light reflecting surface 136. This reflecting surface 136 reflects the light output in an oblique direction among the light emitted by the organic EL element 112 as shown by the arrow in FIG. 6 and it is possible to use the light as effective output light from the pixel 114b. Furthermore, since the auxiliary wiring 120 is formed using a metal material such as aluminum or silver and the like as explained in the first embodiment, it is possible to expect the reflecting surface 136 to have high reflecting properties.

When light output in an oblique horizontal direction from the pixel 114b enters an adjacent pixel, color mixing occurs, the outline of display images become blurred and lead to a deterioration in image quality. In order to solve this, it is possible to control deterioration in image quality by providing the reflecting surface 136 adjacent to the pixel 114b from the second bank 118b and auxiliary wiring 120 as in the present embodiment.

<Connection Between a Common Pixel Electrode and Auxiliary Wiring>

Figure 7:
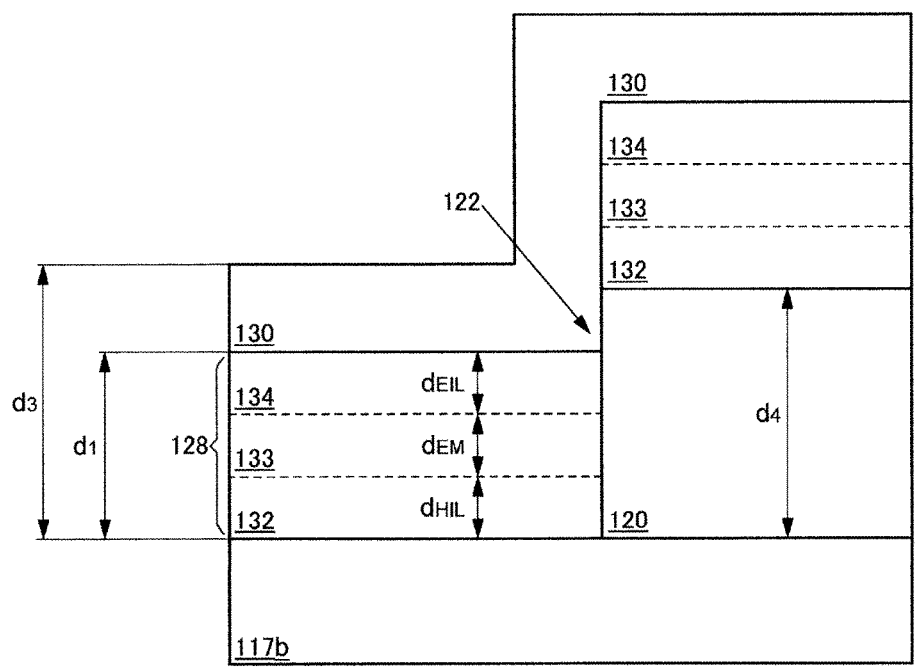
FIG. 7 is a diagram for explaining a connection between a common pixel electrode and auxiliary wiring in a pixel of an organic EL display device related to one embodiment of the present invention.

The form of an electrical connection between the common pixel electrode 130 and auxiliary wiring 120 shown in the present embodiment is explained while referring to FIG. 7.

In the present embodiment, the end part side surface of the auxiliary wiring 120 is located on the upper surface part of the first bank 117b. The end part side surface of the auxiliary wiring 120 formed the step part 122. When the film thickness of the organic EL layer 128 is smaller than the height of the step part 122, the organic EL layer 128 can not completely cover the step part 122 and thereby at least one part of the end part side surface of the auxiliary wiring 120 is exposed.

The common pixel electrode 130 provided on an upper surface of the organic EL layer 128 covers the step part 122. As a result, the common pixel electrode is in contact with the end part side surface of the auxiliary wiring 120 and the common pixel electrode 130 and auxiliary wiring are electrically connected.

In FIG. 7, the film thickness of the organic EL layer 128 is given as d1, the thickness of the auxiliary wiring 120 is given as d4, and the total thickness of the organic EL layer 128 and the common pixel electrode 130 is given as d3. In addition, the film thickness of the hole injection layer 132, light emitting layer 133 and electron injection layer 134 included in the organic EL layer 128 are given HIL, dEM and dEIL respectively.

At this time, when the thickness d4 of the auxiliary wiring 120 is set larger than the film thickness d1 of the organic EL layer 128 (d1<d4> and there are no effects of wrapping of the organic EL layer 128, the step part 122 cannot be buried in the organic EL layer 128. On the other hand, in the case where the total film thickness of the organic EL layer 128 maintaining these conditions and the common pixel electrode 130 provided above is thicker than the height of the second bank 118b, it is possible to contact the common pixel electrode 130 at the end part side surface of the auxiliary wiring 120.

In addition, in the case shown in FIG. 7, even if the film thickness d1 of the organic EL layer 128 is larger than the film thickness of the auxiliary wiring 120, it is sufficient that the condition that the total film thickness (dHIL+dEM) of at least the hole injection layer 132 with a comparatively high resistance and the light emitting layer 133 is smaller than the film thickness d4 of the auxiliary wiring 120 is satisfied ((dHIL+dEM)<d4). In this case, the auxiliary wiring 120 and electron injection layer 134 are in contact. If the resistance of the electron injection layer 134 is sufficiently low, it is possible to electrically connect the common pixel electrode 130 with the auxiliary wiring 120 via the electron injection layer 134.

According to the present embodiment, by providing the step part 122 via the auxiliary wiring 120 on an upper surface part of the first bank 117b, it is possible electrically connect the common pixel electrode 130 and auxiliary wiring 120. In this way, it is possible to reduce the surface resistance of the common pixel electrode 130 and reduce shading which is a problem in organic EL display devices.

Furthermore, by providing the second bank 118b on an upper part of the first bank 117b and providing the auxiliary wiring 120 along a side surface of the second bank 118b, it is possible to use the side surface part as the reflecting surface 136. That is, by reflecting the light output obliquely among the light emitted by the organic EL element 112 in the pixel 114, it is possible to increase the extraction efficiency of light. In addition, since it is possible to prevent light leaking to an adjacent pixel by providing the reflecting surface 126 adjacent to the pixel 114 from the second bank 118b and auxiliary wiring 120, it is possible to control a deterioration in image quality. In addition, since it is possible to reduce the film thickness of the common pixel electrode 130 by providing the auxiliary wiring 120, translucency is improved and it is possible to improve the extraction efficiency of light emitted by the organic EL element 112.

Third Embodiment

<Pixel Structure>

Figure 8:
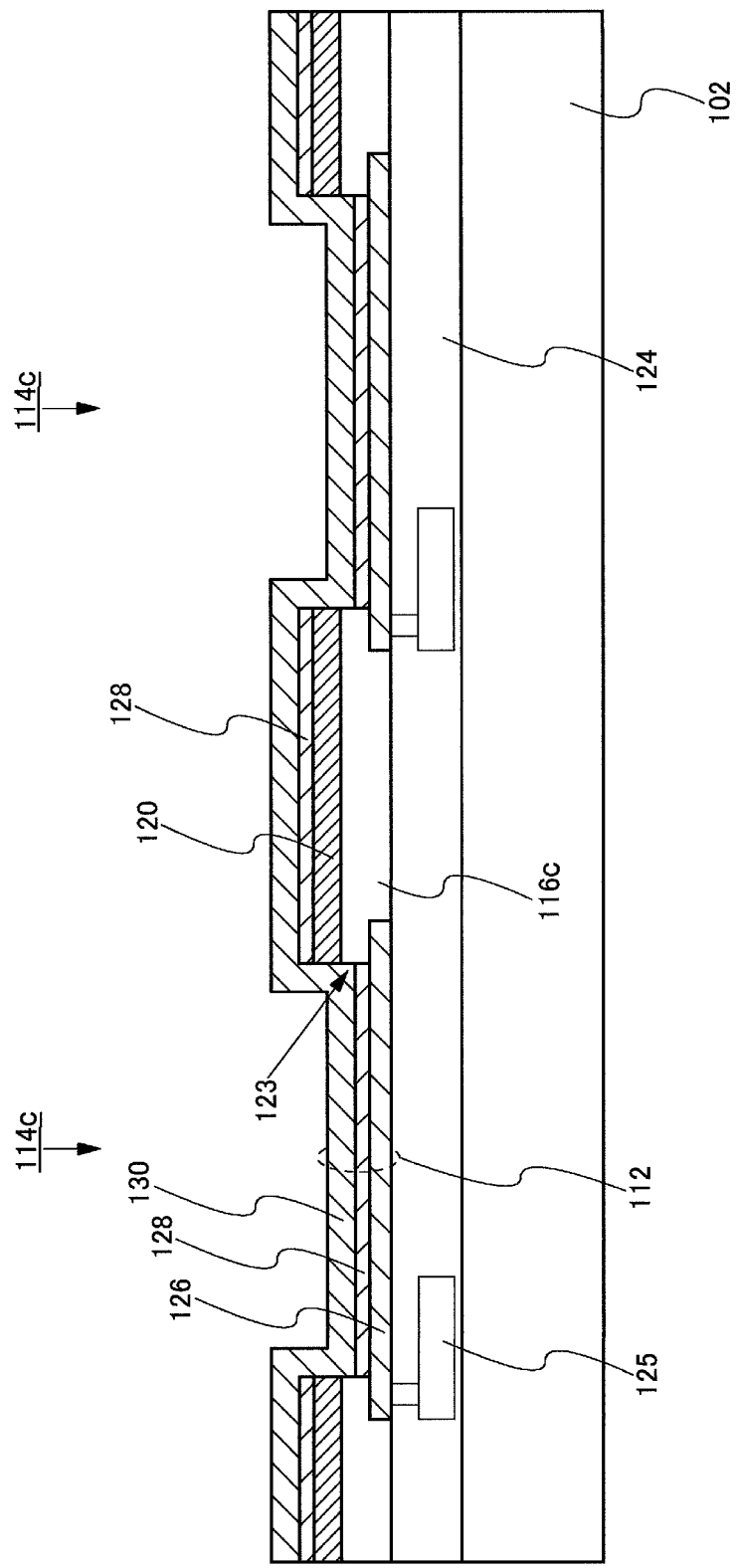
FIG. 8 is a diagram showing a cross-sectional structure of a pixel of an organic EL display device related to one embodiment of the present invention.

FIG. 8 shows a structure of a pixel 118c in a pixel part of an organic EL display device related to the present embodiment. The pixel 114c includes a bank 116c which covers a periphery edge part of a pixel electrode 126 of the organic EL element 112 between pixels. The auxiliary wiring 120 is provided on the entire surface of the bank 116c. The end part of the bank 116c is located on an upper surface part of the pixel electrode 126 to form a step part 123. Although the organic EL layer 128 is provided above the pixel electrode 126 and auxiliary wiring 120, the organic EL layer 128 is separated from the step part 123 by this part. The common pixel electrode 130 is provided to cover the step part 123 and is electrically connected by being in contact with the side surface end part of the auxiliary wiring 120.

It is preferable to set the height of the step part 123 to 2 to 10 times that of the film thickness of the organic EL layer 128 so that the organic EL layer 128 completely covers the step part 123. It is preferred that the end part of the bank 116c and the end part of the auxiliary wiring 120 roughly match and by taking into account the thickness of the auxiliary wiring 120 above the step part 123, it is possible to securely separate the organic EL layer 128 at this part. Using a different viewpoint, if the step part 123 is formed by the bank 116c and the auxiliary wiring 120, it is not necessary to increase the thickness of the bank 116c more than necessary and it is possible to reduce material costs and achieve a narrow gap when providing a sealing substrate. Furthermore, although not shown in the diagram, it is preferred that a protection film is provided on an upper part of the common pixel electrode 130. As long as the protective film is an insulation film that can block the infiltration of water, then a material such as a silicon nitride film may be used.

In this way, it is possible to obtain conductivity between the auxiliary wiring 120 and common pixel electrode 130 by ensuring that the organic EL layer 128 does not cover the step part 123 formed using the bank 116c.

<Connection Between Common Pixel Electrode and Auxiliary Wiring>

Figure 9:
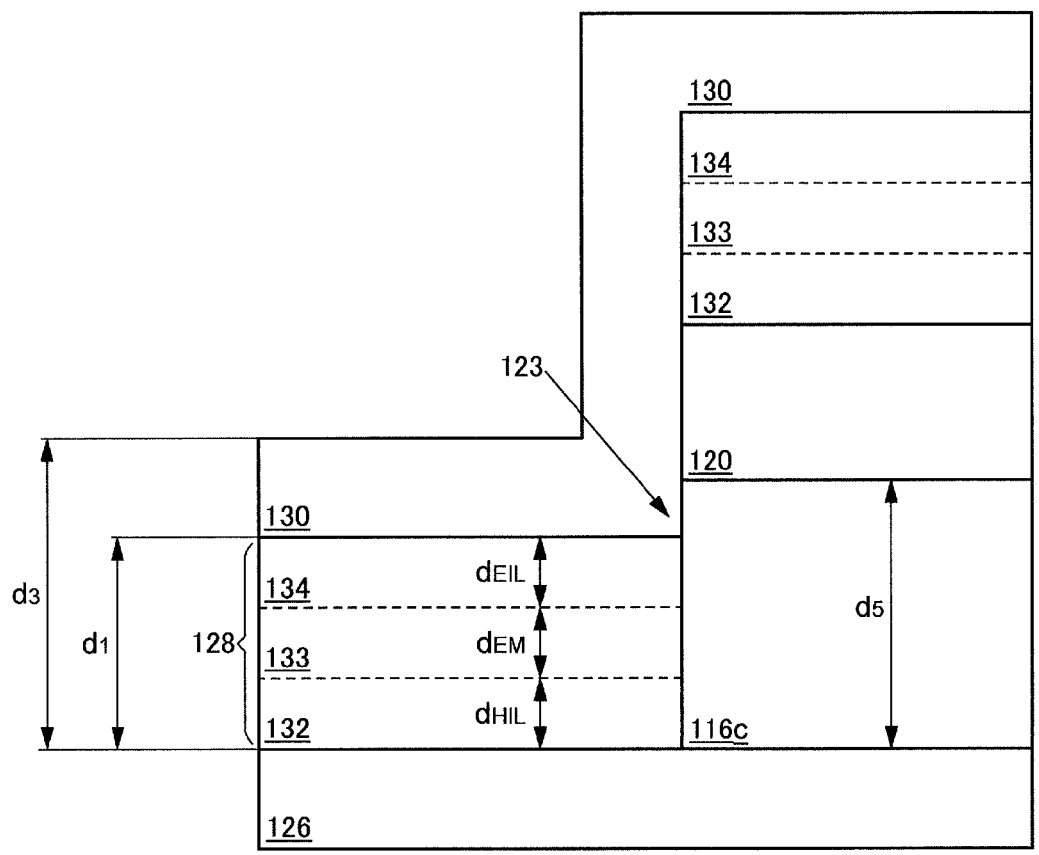
FIG. 9 is a diagram for explaining a connection between a common pixel electrode and auxiliary wiring in a pixel of an organic EL display device related to one embodiment of the present invention.

FIG. 9 shows a concept diagram for explaining a connection between the common pixel electrode 130 and auxiliary wiring 120 in the present embodiment. FIG. 9 shows a form in which the organic EL layer 128 and bank 117c are provided above the pixel electrode 126. The auxiliary wiring 120 is provided on an upper part of the bank 116c and preferably the end parts of both match. When the height of the step part 123 is larger than the film thickness of the organic EL layer 128 due to the bank 116c, since the organic EL layer 128 covers the step part 123, a structure is obtained in which the side surface end part of the auxiliary wiring 120 is not covered by the organic EL layer 128.

In FIG. 9, film thickness of the organic EL layer 128 is given as d1, the height of the bank 116c is given as d5, and the total thickness of the organic EL layer 128 and the common pixel electrode 130 is given as d3. In addition, the film thickness of the hole injection layer 132, light emitting layer 133 and electron injection layer 134 included in the organic EL layer 128 are given HIL, dEM and dEIL respectively.

When the height d5 of the bank 116c is set larger than the thickness d1 of the organic EL layer 128 (d1<d5> and the organic EL layer 128 is separated in the step part 123, the organic EL layer 128 can not completely cover the side surface end part of the auxiliary wiring 120. On the other hand, in the case where the total film thickness of the organic EL layer 128 maintaining these conditions and the auxiliary wiring 120 provided above is thicker than the height of the bank 116c, the common pixel electrode 130 contacts the side surface end part of the auxiliary wiring 120.

In addition, even if the film thickness d1 of the organic EL layer 128 is larger than the height of the bank 116c, if the condition that the total film thickness (dHIL+dEM) of at least the hole injection layer 132 with a comparatively high resistance and the light emitting layer 133 is smaller than height d5 of the bank 116c is satisfied ((dHIL+dEM)<d5), and if the auxiliary wiring 120 and electron injection layer 134 with a relatively small resistance are in contact, it is possible to electrically connect the common pixel electrode 130 with the auxiliary wiring 120 via the electron injection layer 134.

In order to expose at least one part of the side surface part of the auxiliary wiring 120 without the step part 123 covering the organic EL layer 128 by the bank 116c, it is preferred to provide the step part 123 with 2 to 10 times the height with respect to the film thickness of the organic EL layer 128.

<Manufacturing Method>

Figure 10A:
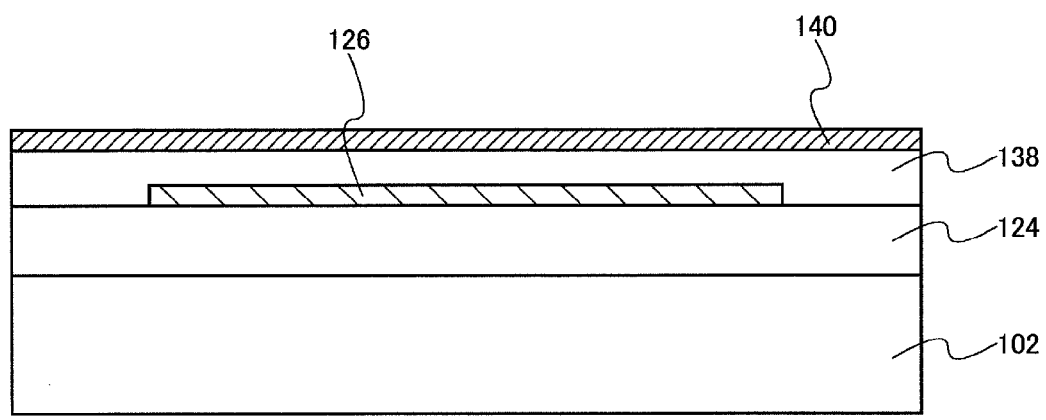
FIG. 10A is a diagram for explaining a manufacturing method of a pixel part of an organic EL display device related to one embodiment of the present invention.
Figure 10B:
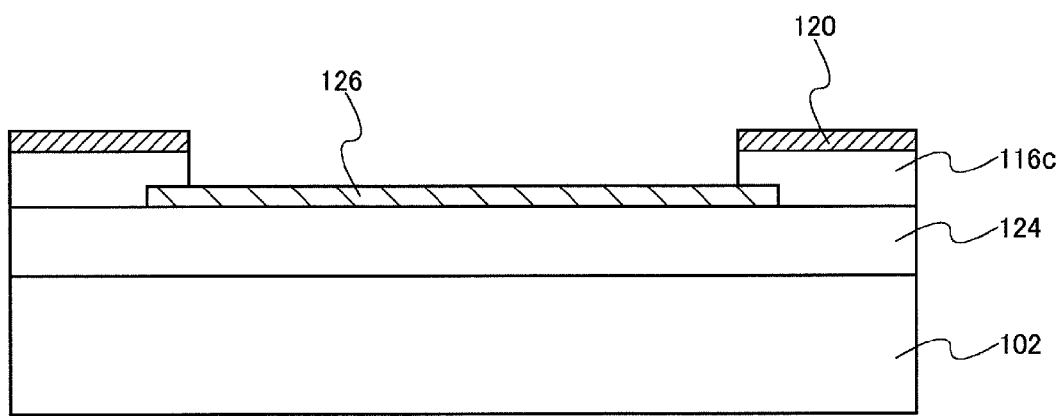
FIG. 10B is a diagram for explaining a manufacturing method of a pixel part of an organic EL display device related to one embodiment of the present invention.
Figure 10C:
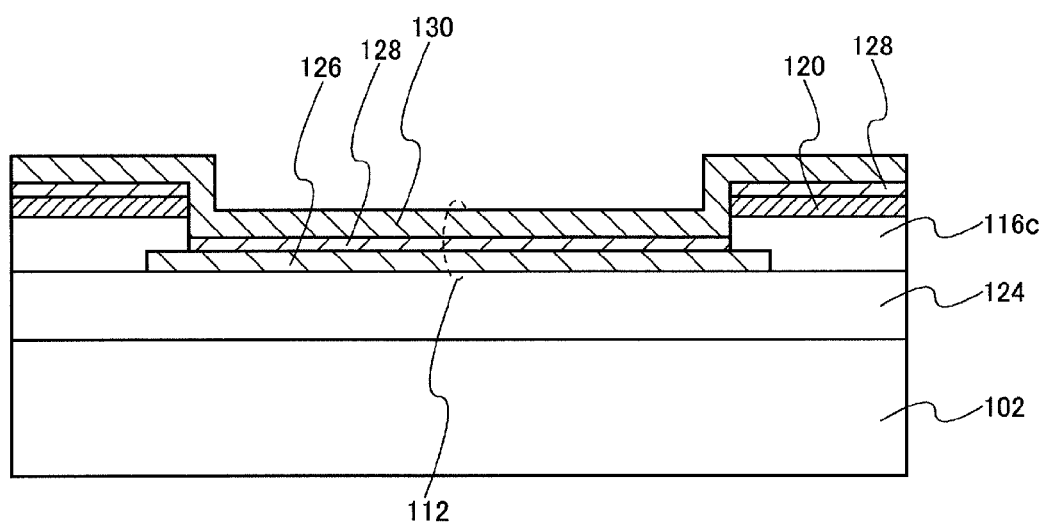
FIG. 10C is a diagram for explaining a manufacturing method of a pixel part of an organic EL display device related to one embodiment of the present invention.

A manufacturing method of an organic EL display device related to the present embodiment is explained while referring to FIG. 10A to FIG. 10C.

As is shown in FIG. 10A, an insulation film 138 is formed in order to form a bank in order to bury the pixel electrode 126. A metal film 140 is formed above the insulation film 138 in order to form auxiliary wiring.

As is shown in FIG. 10B, the auxiliary wiring 120 is formed by etching a metal film 140. Processing of the metal film 140 can be performed by a photolithography process. At this time, it is possible to form the bank 116c using a mask pattern or manufactured auxiliary wiring 120 with respect to the metal film 140. The end part of the bank 116c is located on an upper surface of the pixel electrode 126 and the step part 123 is formed on this part. As described above, if the insulation film 138 is etched using an etching mask of the auxiliary wiring 120 or the auxiliary wiring 120, it is possible to match the auxiliary wiring 120 with the end part of the bank 116c. The height of the step part 123 is equal to the film thickness of the insulation film 138. The height of the step part 123 is preferred to be formed 2 to 10 times the film thickness of the organic EL layer 128 as described above.

As is shown in FIG. 10C, the organic EL layer 128 and common pixel electrode 130 are formed to cover the pixel electrode 126 and step part 123. The organic EL layer 128 is separated since the height of the step part 123 is the same or more than the film thickness of the organic EL layer 128. As a result, the side surface end part of the auxiliary wiring 120 is not covered by the organic EL layer 128 and at least one part is exposed. The common pixel electrode 130 is formed to cover the step part 123 in this state. Since at least a part of the side surface end part of the auxiliary wiring 120 is exposed, it is possible to form a structure in which the common pixel electrode 130 and the auxiliary wiring 120 are electrically connected.

Furthermore, the step part can be viewed as being formed via both the bank 116c and the auxiliary wiring 120 and in this case the film thickness of both the bank 116c and auxiliary wiring 120 should be considered in order to obtain the necessary height with respect to the step part 123. That is, it is not necessary to increase the film thickness of only one of the bank 116c or auxiliary 120 which is advantageous in achieving miniaturization of a pixel part. In addition, since it is possible to manufacture the auxiliary wiring 120 and bank 116c in the same mask process, it is possible to simplify processing.

Modified Example

Figure 11:
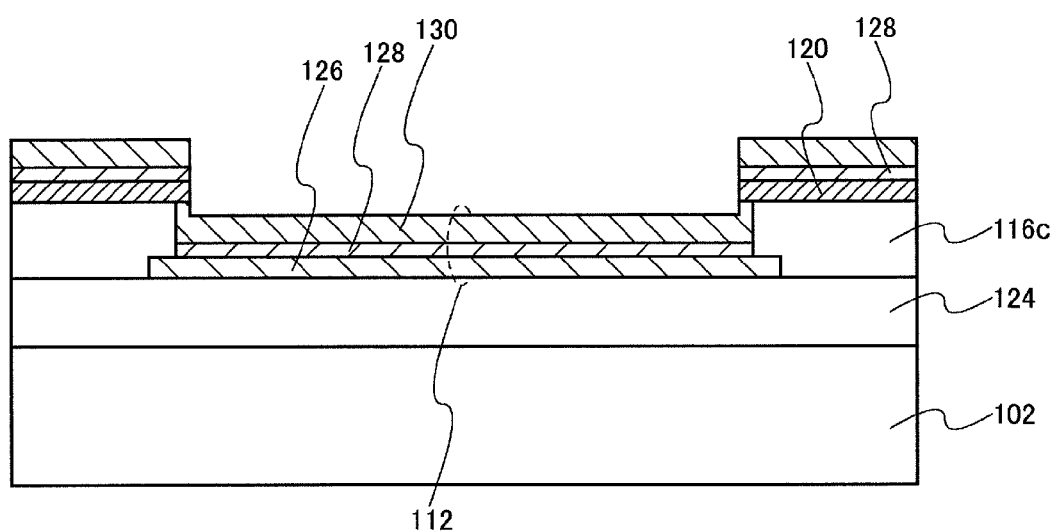
FIG. 11 is a diagram showing a cross-sectional structure of a pixel of an organic EL display device related to one embodiment of the present invention.

FIG. 11 shows an example in the case where the height of the bank 116c is higher than the total film thickness of the organic EL layer 128 and the common pixel electrode 130. Even in the case where the height of the step part 123 exceeds the total film thickness of the organic EL layer 128 and the common pixel electrode 130, it is possible to achieve an electrical connection between the common pixel electrode 130 and the auxiliary wiring 120 by adjusting the form of the bank 116c and auxiliary wiring 120.

In this case, when etching the bank 116c, processing is performing by over-etching so that the bottom surface of the auxiliary wiring 120 is exposed. In addition, the common pixel electrode 130 is formed so as to wrap around the bottom surface part of the auxiliary wiring 120. For example, by over-etching the bank 116c using a sputtering method, vapor deposition method or oblique deposition method, the common pixel electrode 130 is formed so as to wrap around the bottom surface of part of the exposed auxiliary wiring 120.

Figure 12:
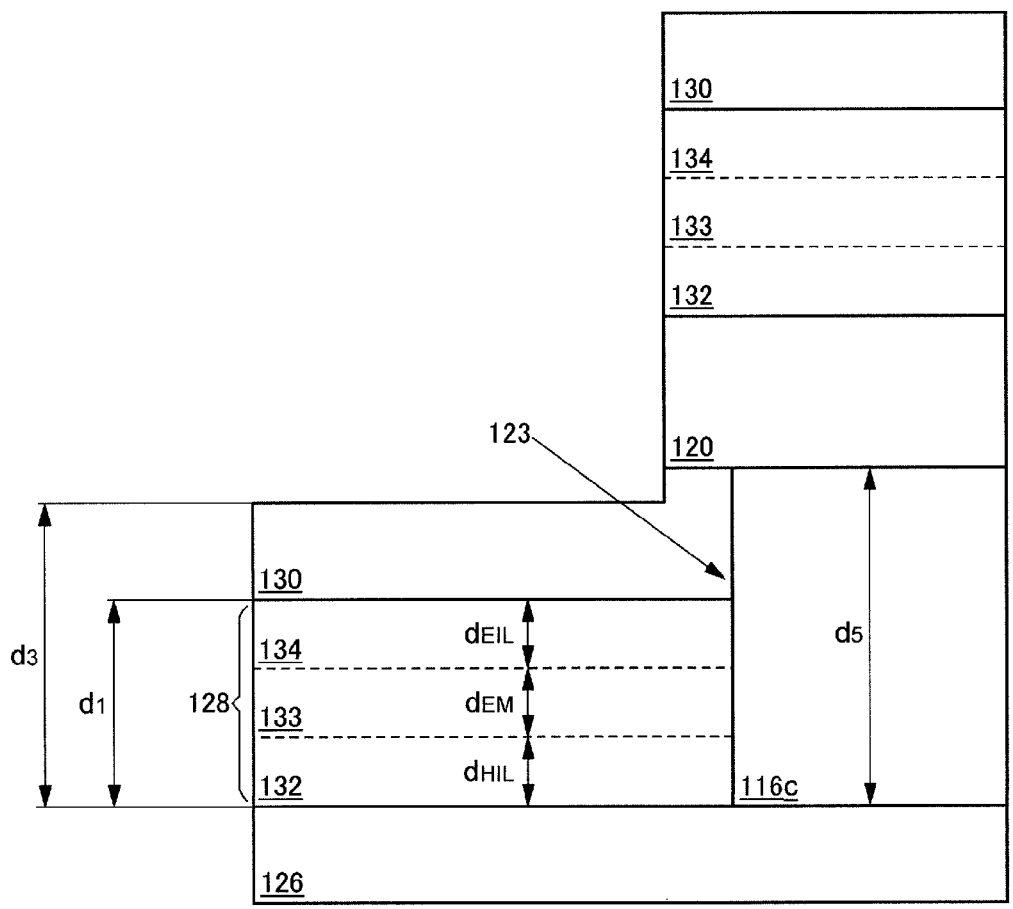
FIG. 12 is a diagram for explaining a connection between a common pixel electrode and auxiliary wiring in a pixel of an organic EL display device related to one embodiment of the present invention.

This type of connection structure is explained while referring to FIG. 12. The film thickness d5 of the bank 116c is larger than the total thickness d3 of the organic EL layer 138 and common pixel electrode 130 (d5>d3). The auxiliary wring 120 is provided so that an end part protrudes to the exterior of the bank 116c. That is, the auxiliary wiring 120 includes a structure in which not only the end part side surface but a part of the bottom surface is exposed in an upper part of the bank 116c.

Even in the case where the common pixel electrode 130 is separated by the step part 123, the common pixel electrode 130 is in contact with the bottom surface part of the auxiliary wiring 120 along the partition wall of the bank 116c. In this way, it is possible to form an electrical connection between the common pixel electrode 130 and the auxiliary wiring 120.

According to the present embodiment, it is possible to electrically connect the auxiliary wiring 120 and the common pixel electrode 130 using the step part 123 formed from the bank 116c. In this way, it is possible to reduce the surface resistance of the common pixel electrode 130 and reduce shading which is a problem in organic EL display devices. By using the step part 123 from the bank 116c, it is not necessary to increase the film thickness of the auxiliary wiring 120 more than necessary. In other words, by providing the auxiliary wiring so that the end part roughly matches above the bank 116c, it is not necessary to increase the film thickness of the bank 116c more than necessary.

As a manufacturing advantage, since it is possible to form the bank 116c using the pattern of the auxiliary wiring 120, it is possible to simplify processing.

Fourth Embodiment

<Pixel Structure>

Figure 13:
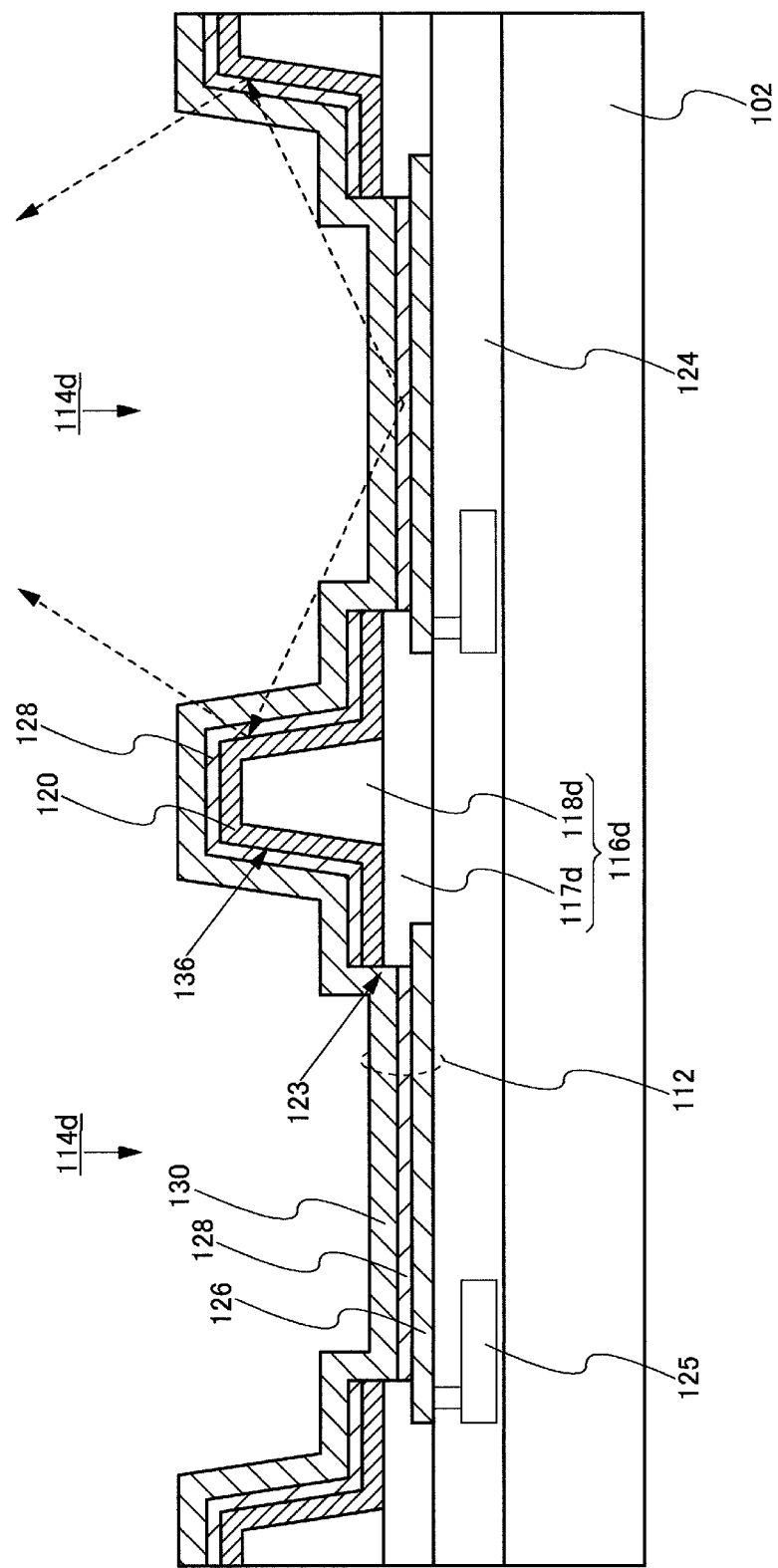
FIG. 13 is a diagram showing a cross-sectional structure of a pixel of an organic EL display device related to one embodiment of the present invention.

FIG. 13 shows a structure of a pixel part of an organic EL display device related to the present embodiment. In FIG. 13, a bank 116d is provided between adjacent pixels. The auxiliary wiring 120 is provided on an upper part of the bank 116d. The bank 116d includes a first bank 117d and second bank 118d.

The second bank 118d is provided on an upper part of the first bank 117d. A side surface of the second bank 118d is preferred to be an incline surface. The auxiliary wiring 120 is provided to cover a part (preferably the side surface part) or entire surface of the second bank 118d. The organic EL layer 128 is provided above the auxiliary wiring 120 to cover the upper surface part from the incline part of the first bank 117d and the second bank 118d.

Since the cross-sectional structure shown in FIG. 13 shows the structure corresponding to the line A1-A2 shown in FIG. 2A, the auxiliary wiring 120 is provided extending in at least one direction within a region of the pixel part. In addition, although not shown in the diagram, it is preferred that a protection film be provided on an upper part of the common pixel electrode 130. As long as the protective film is an insulation film that can block the infiltration of water, then a material such as a silicon nitride film may be used.

The first bank 117d is provided so as to cover a periphery edge part of the pixel electrode 126. The end part of the first bank 117d matches the end part of the auxiliary wiring 120. The height of the first bank 117d is provided to be larger than the film thickness of the organic EL layer 128. Although the organic EL layer 128 is formed above the pixel electrode 126 and auxiliary wiring 120, due to the effects of the step part via the first bank 117d, the organic EL layer 128 is separated at this part. Since the organic EL layer 128 is separated by due to this step part 123, at least the side surface end part of the auxiliary wiring 120 is exposed.

By providing the common pixel electrode 130 provided above the organic EL layer 128 so as to cover the step part 123, the common pixel electrode 130 is in contact and electrically connected with the side surface part of the auxiliary wiring 120.

In the present embodiment, the second bank 118d is provided to protrude on an upper part of the first bank 117d. It is possible to increase the extraction efficiency of light emitted by the organic EL element 112 using this structure.

For example, by opening the second bank 118d towards the output direction of light to form an incline surface and providing the auxiliary wiring 120 along the incline surface as is shown in FIG. 13, it is possible to use the incline surface as the light reflecting surface 136. As is shown by the arrow in FIG. 13, the reflecting surface 136 reflects light output in an oblique direction among the light emitted by the organic EL element 112. In this way, it is possible to use the light as effective output light from the pixel 114. As explained in the first embodiment, since the auxiliary wiring 120 is formed from a metal material such as aluminum or silver and the like, the reflectance of the reflecting surface has the reflectance of this metal.

When light output in an oblique horizontal direction from a pixel enters an adjacent pixel, color mixing occurs, the outline of display images become blurred and lead to a deterioration in image quality. In order to solve this, it is possible to control deterioration in image quality by providing the reflecting surface 136 adjacent to the pixel 114b from the second bank 118b and auxiliary wiring 120 as in the present embodiment.

<Manufacturing Method>

Figure 14A:
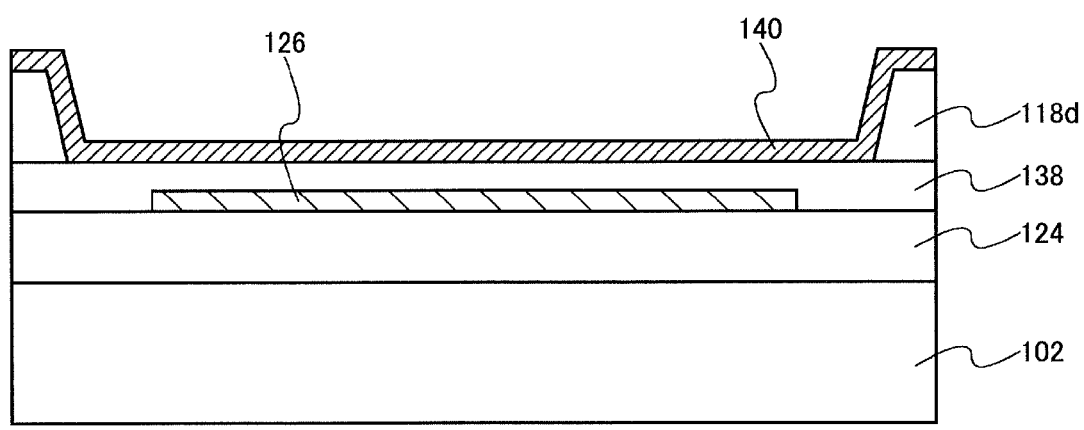
FIG. 14A is a diagram for explaining a manufacturing method of a pixel part of an organic EL display device related to one embodiment of the present invention.
Figure 14B:
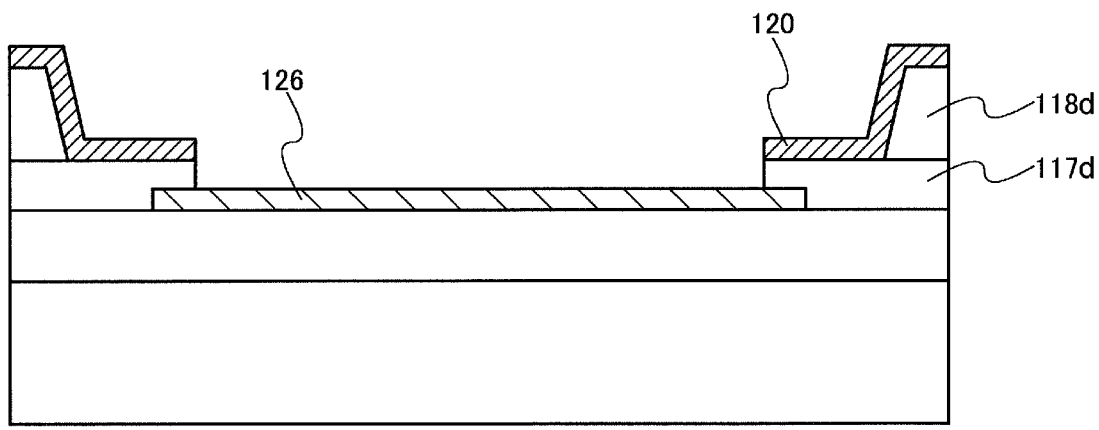
FIG. 14B is a diagram for explaining a manufacturing method of a pixel part of an organic EL display device related to one embodiment of the present invention.
Figure 14C:
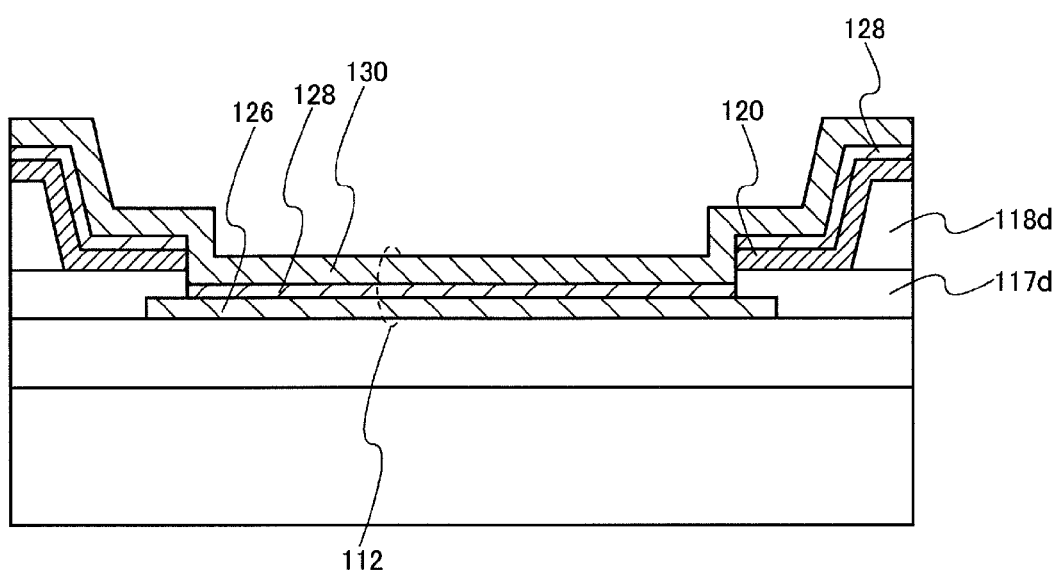
FIG. 14C is a diagram for explaining a manufacturing method of a pixel part of an organic EL display device related to one embodiment of the present invention.

A manufacturing method of an organic EL display device related to the present embodiment is explained while referring to FIG. 14A to FIG. 14C.

As is shown in FIG. 14A, an insulation film 138 is formed in order to bury the pixel electrode 126. The bank 118d is formed above the insulation film 138 and a metal film 140 for forming auxiliary wiring is further formed on the entire surface. The insulation film 138 is formed from organic material such as polyimide or acrylic or an inorganic material such as silicon oxide. The second bank 118d is formed from the same material. The metal film 140 may be formed using a metal material such as aluminum or silver and a layer may be provided to achieve a good ohmic connection using a titanium, molybdenum, tungsten or a metal alloy selected from these (for example, molybdenum/tungsten allow) so as to sandwich above and below the metal layer.

As is shown in FIG. 14B, the auxiliary wiring 120 is formed by etching the metal film 140. Processing of the metal film 140 can be performed by a photolithography process. At this time, it is possible to form the first bank 117d using a mask pattern or manufactured auxiliary wiring 120 with respect to the metal film 140. The end part of the first bank 117d is located on an upper surface of the pixel electrode 126 and the step part 123 is formed on this part. The end part of the auxiliary wiring 120 and first bank 117*d* can be matched. Although the height of the step part 123 is equal to the film thickness of the insulation film 124, it is preferred that the height of the step part 123 be formed 2 to 10 times the film thickness of the organic EL layer 128 as described above.

As is shown in FIG. 14C, the organic EL layer 128 and common pixel electrode 130 are formed to cover the pixel electrode 126 and auxiliary wiring 120. Since the height of the step part 123 is more than the film thickness of the organic EL layer 128, the organic EL layer 128 is separated by the step part 123. As a result, the side surface end part of the auxiliary wiring 120 is not covered by the organic EL layer 128 and at least one part is exposed. The common pixel electrode 130 is formed in this state so as to bury the step part 123. By exposing at least one part of the side surface end part of the auxiliary wiring 120, it is possible to form a structure in which the common pixel electrode 130 and auxiliary wiring are electrically connected. In this case, by providing the step part 123 in the bank 116*d*, it is not necessary to increase the thickness of the auxiliary wiring 120 more than necessary which is effective when miniaturizing the auxiliary wiring 120.

According to the present embodiment, it is possible to electrically connect the auxiliary wiring 120 and common pixel electrode 130 even when a step formed by the first bank 117*d* is used. By using a step formed by the first bank 117*d*, it is not necessary to increase the film thickness of the auxiliary wiring 120 more than necessary.

In addition, by providing the step part 123 using the first bank 117*d*, it is possible to electrically connect the common pixel electrode 130 and auxiliary wiring 120. It is possible to reduce the surface resistance of the common pixel electrode 130 using the auxiliary wiring 120 when forming the common pixel electrode 130 using a transparent conductive material. In this possible to reduce shading which is a problem in organic EL display devices.

By providing the second bank 118*d* on an upper part of the first bank 117*d* and providing the auxiliary wiring 120 along a side surface of the second bank 118*d*, it is possible to use the side surface part as the reflecting surface 136. That is, by reflecting the oblique output light among the light emitted from the organic EL element 112 in the pixel 114*d* using this reflecting surface, it is possible to increase the extraction efficiency of light. By providing the reflecting surface 136 adjacent to the pixel 114*d* from the second bank 118*d* and auxiliary wiring 120, it is possible to prevent light leaking to an adjacent pixel and thereby control a deterioration in image quality. In addition, by providing the auxiliary wiring 120, it is possible to reduce the thickness of the common pixel electrode 130 and thereby improve translucency and improve the extraction efficiency of light emitted by the organic EL element 112.

What is claimed is:

1. An organic electroluminescence display device comprising:
   a plurality of pixels located in a pixel part;
   a pixel electrode provided for each of the plurality of pixels;
   a first bank provided between the plurality of pixels and covering a periphery edge part of the pixel electrode;
   a second bank provided on a first upper surface of the first bank and including a second upper surface and a first side surface, the first side surface intersecting the first upper surface and the second upper surface;
   an auxiliary wiring provided on the second upper surface of the second bank and including a third upper surface and a second side surface intersecting the third upper surface;
   an organic electroluminescence layer in contact with the pixel electrode, the first bank, the second bank, and the auxiliary wiring; and
   a common pixel electrode bridging the plurality of pixels and covering the pixel electrode, the first bank, the second bank, and the auxiliary wiring,
   wherein:
   the organic electroluminescence layer includes a first region and a second region separated from the first region;
   the first region is in contact with the pixel electrode, the first upper surface, and the first side surface;
   the second region is in contact with the auxiliary wiring; and
   the common pixel electrode has a continuous region in contact with the first region, the first side surface, and the second side surface.

2. The organic electroluminescence display device according to claim 1, wherein the first upper surface includes an end part, and the first side surface is located on an inside of the end part.

3. The organic electroluminescence display device according to claim 2, wherein a height of the second bank is larger than a thickness of the organic electroluminescence layer.

4. The organic electroluminescence display device according to claim 2, wherein the organic electroluminescence layer includes a hole injection layer, a light emitting layer, and an electron injection layer, and a height of the second bank is larger than a total thickness of the hole injection layer and the light emitting layer.

5. The organic electroluminescence display device according to claim 1, wherein the first bank includes an incline surface having a thickness increasing towards an interior from an end part overlapping the pixel electrode, and an angle formed by the first upper surface and the first side surface is larger than an angle formed by the incline surface and a main surface of the pixel electrode.

6. The organic electroluminescence display device according to claim 1, wherein the first side surface matches with the second side surface.

7. The organic electroluminescence display device according to claim 1, wherein an end part of the first side surface is in contact with an end part of the second side surface.

8. An organic electroluminescence display device comprising:
   a plurality of pixels located in a pixel part;
   a pixel electrode provided for each of the plurality of pixels;
   a bank provided between the plurality of pixels and covering a periphery edge part of the pixel electrode;
   an auxiliary wiring provided on the bank;
   an organic electroluminescence layer in contact with the pixel electrode, the bank, and the auxiliary wiring; and
   a common pixel electrode bridging the plurality of pixels and covering the pixel electrode, the bank, and the auxiliary wiring,
   wherein:

the auxiliary wiring has a bottom surface on and in physical contact with an upper surface of the bank, and a side surface intersecting the bottom surface;
the side surface intersects the upper surface;
the side surface and the upper surface form a step part;
the organic electroluminescence layer is separated at the step part; and
the common pixel electrode is in contact with the side surface of the auxiliary wiring.

9. The organic electroluminescence display device according to claim 8, wherein a height of the step part is larger than a thickness of the organic electroluminescence layer.

10. The organic electroluminescence display device according to claim 8, wherein the organic electroluminescence layer includes a hole injection layer, a light emitting layer, and an electron injection layer, and a height of the step part is larger than a total thickness of the hole injection layer and the light emitting layer.

11. The organic electroluminescence layer display device according to claim 8,
wherein:
the bank includes a first bank and a second, bank;
the first bank includes the upper surface and is in contact with the pixel electrode; and
the second bank is formed on the upper surface, has an end part located on an inside of the step part, and is provided on a lower layer side of the auxiliary wiring.

12. The organic electroluminescence display device according to claim 11, wherein the second bank includes an incline surface and the auxiliary wiring is provided along the incline surface.

13. An organic electroluminescence display device comprising:
a plurality of pixels located in a pixel part;
a pixel electrode provided for each of the plurality of pixels;
a bank provided between the plurality of pixels and covering a periphery edge part of the pixel electrode;
an auxiliary wiring provided on the bank;
an organic electroluminescence layer in contact with the pixel electrode, the bank, and the auxiliary wiring; and
a common pixel electrode bridging the plurality of pixels and covering the pixel electrode, the bank, and the auxiliary wiring,
wherein:
the bank includes a first side surface intersecting a main surface of the pixel electrode;
the auxiliary wiring includes a second side surface intersecting the first side surface;
the organic electroluminescence layer is separated at the first side surface and the second side surface; and
the common pixel electrode is in contact with the second side surface of the auxiliary wiring.

14. The organic electroluminescence display device according to claim 13, wherein a height of the first side surface is larger than a thickness of the organic electroluminescence layer.

15. The organic electroluminescence display device according to claim 13, wherein the organic electroluminescence layer includes a hole injection layer, a light emitting layer, and an electron injection layer, and a height of the first side surface is larger than a total thickness of the hole injection layer and the light emitting layer.

16. The organic electroluminescence display device according to claim 13, wherein the bank includes a first bank and a second bank,
the first bank is in contact with the pixel electrode, and
the second bank is formed on a top surface of the first bank, has an end part located on an inside of the second side surface, and is provided on a lower layer side of the auxiliary wiring.

17. The organic electroluminescence display device according to claim 16, wherein the second bank includes an incline surface, and the auxiliary wiring is provided along the incline surface.

18. The organic electroluminescence display device according to claim 13, wherein an end part of the first side surface is in contact with an end part of the second side surface.

* * * * *